(12) United States Patent
Burns et al.

(10) Patent No.: US 6,343,178 B1
(45) Date of Patent: Jan. 29, 2002

(54) MICROMACHINED VOLTAGE CONTROLLED OPTICAL ATTENUATOR

(75) Inventors: Brent E. Burns, Rancho Palos Verdes; Tseng-Yang Hsu, Pasadena, both of CA (US)

(73) Assignee: Integrated Micromachines, Inc., Pasadena, CA (US)

( * ) Notice: Subject to any disclaimer, the term of this patent is extended or adjusted under 35 U.S.C. 154(b) by 0 days.

(21) Appl. No.: 09/707,602

(22) Filed: Nov. 7, 2000

(51) Int. Cl.$^7$ ................................................. G02B 6/00
(52) U.S. Cl. ...................................... 385/140; 359/847
(58) Field of Search ................................. 385/140, 147; 359/846, 224, 847, 53.2; 250/227.27, 227.23, 231.19

(56) References Cited

U.S. PATENT DOCUMENTS

| | | | |
|---|---|---|---|
| 4,983,824 A | * 1/1991 | Saaski et al. ........... | 250/227.27 |
| 5,022,745 A | 7/1991 | Zayhowski et al. | |
| 5,247,490 A | 9/1993 | Goepel et al. | |
| 5,396,364 A | 3/1995 | O'Meara et al. | |
| 5,471,341 A | 11/1995 | Warde et al. | |
| 5,719,846 A | * 2/1998 | Matoba et al. ............ | 359/291 |
| 5,821,596 A | 10/1998 | Miu et al. | |
| 5,880,896 A | * 3/1999 | Ishii et al. ................. | 359/224 |
| 5,915,063 A | 6/1999 | Colbourne et al. | |
| 5,926,309 A | 7/1999 | Little | |
| 5,978,128 A | 11/1999 | Yoon | |
| 5,991,066 A | 11/1999 | Robinson et al. | |

* cited by examiner

*Primary Examiner*—Akm E. Ullah
(74) *Attorney, Agent, or Firm*—Liu & Liu LLP (57) ABSTRACT

This invention provides a very sensitive optical attenuator, which can be used to couple and attenuate optical signals between optical fibers with a wide range of attenuation level. Such an optical attenuator includes a flexible conductive membrane to be moved by an external force, such as electrostatic force, to achieve deformation of the conductive membrane. The conductive membrane can be formed, for example, by a vacuum deposited silicon nitride film. A thin metallic, conductive layer is then deposited on the flexible membrane to form a reflective mirror to receive and reflect incident optical signals. The semiconductor structure includes one or more spacing posts, with which the first structural member is to be joined and bonded. Electrodes are placed on the semiconductor structure in close proximity to the flexible membrane. At various areas of the semiconductor structure, additional spacing posts are added to cause deformation of the conductive membrane when a voltage is applied between the membrane and the electrodes on the semiconductor structure.

16 Claims, 9 Drawing Sheets

MICROMACHINED VOLTAGE CONTROLLED OPTICAL ATTENUATOR

BACKGROUND OF THE INVENTION

1. Field of the Invention

This invention relates to an optical attenuator, and more particularly to a voltage-controlled variable optical attenuator used in fiber-optic transmission systems, having a deformable mirror structure. This invention also relates to techniques for fabricating such an optical attenuator.

2. Description of Related Art

In a fiber-optic transmission system, it is often necessary to couple optically one or more optical fibers with one or more other optical fibers. Further, it is also often necessary to reduce the power level of an optical signal to be received by the receiving optical fiber. The device used to achieve such result is often known as an optical attenuator. For example, an optical attenuator is used to match the intensity of the incoming optical signal to the optimum operating level of a receiver. An optical attenuator is also an essential element of any gain equalization component in a fiber-optic transmission system, which aims at readjusting the power in the optical channel to correct signal distortions experienced throughout the transmission spans.

One of the common ways of making an optical attenuator is to employ a movable mirror, upon which the incident optical signal will impinge. In the nominal position, the mirror is initially adjusted so that there is minimum attenuation of the incident optical signal. An external force will then be applied to rotate the mirror, causing the reflected optical signal to deviate from its initial direction. The deviation, often controlled through the magnitude of the external force, will effect a partial misalignment of the reflected beam relative to the axis of the receiving optical fiber. The misalignment will then result in a corresponding attenuation of the input optical signal at the receiving end.

There are several general design considerations for an optical attenuator with a rotatable mirror. The first is the reliability of the actuating mechanism, as well as the magnitude of the actuating force required. It is generally desirable to maintain a low level of actuating force, thus less power consumption, required to move the mirror. The second is the size of the mirror and the entire attenuator as a whole. With the prevailing trend toward miniaturization of optical components, it is desirable to reduce the size of the attenuator while maintaining its reliability. Finally, modern optical components are often highly priced. One of the reasons is the complicated manufacturing processes that are involved in making miniaturized, reliable components. Thus, another desirable characteristic of an optical attenuator is its ability to be mass-produced in a simple and cost efficient manner. There exist some known proposals for the design of an optical attenuator or a rotatable or deformable mirror; however, all of them have shortcomings in light of the design considerations described above.

U.S. Pat. No. 5,915,063 to Colbourne, et. al. describes a variable optical attenuator that has a flexure member consisting of a bridge portion joining two prongs, which move flexibly relative to the bridge portion. A mirror is mounted on the bridge portion. It proposes an actuating system, whereby the two prongs will change their dimensions in response to a control signal, which can be heat, electric field, or magnetic field. The asymmetric expansion or contraction of the two prongs will then cause the bridge portion, and thus the mirror, to tilt. However, the inventors recognize certain shortcomings in the proposed actuating system. For example, if piezoelectric elements are used for the two prongs, while they have a short response time to the voltage applied across them, then they are subject to hysteresis, which impairs the reliability and repetitiveness of the operation of the attenuator. Further, the electrode materials tend to migrate into the piezoelectric materials as a result of sustained voltage, causing potential short-circuiting in the piezoelectric members. When other materials, such as metals, are used to respond to thermal signals, the response time is considerably longer.

U.S. Pat. No. 5,022,745 to Zaykowski, et. al. describes an electrostatically deformable single crystal dielectrically coated mirror comprising a highly conductive thick substrate layer and a highly conductive thinner membrane layer separated from the thick layer by an insulator. The insulator is etched at its center to form a cavity. A voltage is applied between the membrane and the thick substrate to cause the membrane to deform. The inventors suggest that the deformable mirror can be used in tunable optical filters and steeling laser beams. The '745 patent discloses both the thick and thinner membrane layers to be highly doped conducting silicon wafers. For the thinner membrane layer, one surface of the thinner membrane, facing away from the thick layer, must be polished optically flat before a dielectric coating is applied on it to form a mirror.

Further, the inventors emphasize that the membrane must be of a certain thickness, enough to support the high-quality, multilayer, dielectric coatings required for many optical applications. The inventors specifically limit some of their claims to a mirror layer with a thinner substrate, which is substantially thicker than 10 microns and is sufficiently thick to support the mirror layer.

In an article titled "Micromachined Adapative Mirrors" by Gleb Vdovin of the Laboratory of Electronic Instrumentation at Delft University of Technology in the Netherlands, found on the Internet through the link, http://guernsey.et.tudelft.nl/tyson4/index.html, the author discloses a bulk micromachined adaptive mirror that consists of a thin membrane made of silicon nitride. The author also discloses the use of electrostatic control as an actuating mechanism to deform a mirror. However, in order to increase the sensitivity of the mirror to the electrostatic voltage applied, and thus increasing the deformation range of the mirror, a biasing voltage is applied to the flexible membrane of the mirror. This system increases the number of electrodes that needs to be in place, thus complicating the manufacturing processes. Further, the author suggests using a high bias voltage in the range of 100 to 300 V, together with lower control voltages in the range of 10 to 50 V. The use of a high bias voltage also decreases the practicality, flexibility and usability of this attenuation system in a fiber-optic transmission network.

This present invention provides a simple and reliable optical attenuator, which has an extremely thin membrane for the mirror and can be operated at low voltage. Further, by using photolithography and bulk micromachining technology, this invention provides an optical attenuator that is sensitive to the changes of the low actuating voltage and yet can still be manufactured in a simple and cost efficient manner.

SUMMARY OF THE INVENTION

This invention provides a very sensitive optical attenuator, which can be used to couple and attenuate optical signals between optical fibers, with a wide range of attenuation level. Such an optical attenuator includes a flexible conductive membrane to be moved by an external force, such as electrostatic force, to achieve deformation of the conductive membrane. The conductive membrane can be formed, for example, by a low pressure chemical vapor deposited silicon nitride film. A thin metallic, conductive layer is then deposited on the flexible membrane to form a reflective mirror to receive and reflect incident optical signals. The semiconductor structure includes one or more spacing posts with which the first structural member is to be joined and bonded. Electrodes are placed on the semiconductor structure in close proximity to the flexible membrane. At various areas of the semiconductor structure, additional spacing posts are added to cause deformation of the conductive membrane when a voltage is applied between the membrane and the electrodes on the semiconductor structure. The spacing between the membrane and the semiconductor structure is determined by the height of the spacer pads. The height of the spacer pads can be chosen based on various parameters, including the optical properties of the optical signals to be attenuated by such attenuator, as the amount of deformation allowed for the membrane will affect the wavefront qualities as well as the mode field of the reflected beam. In one embodiment, the precise height of such spacer pads is determined by a controlled epitaxial growth of silicon crystal over the semiconductor structure.

In accordance with a particular embodiment of the invention, in addition to the flexible membrane and semiconductor structure disclosed above, such an optical attenuator also includes an original light source emitting an optical signal via a fiber optic waveguide and a receiving fiber optic waveguide to receive reflected optical signal. In one embodiment, a dual collimator is placed over the flexible membrane so that the incident optical signal is emitted through one collimator and reflected by the conductive membrane, and the reflected signal is received through the second collimator. The dual collimator is chosen so that the angle at which the incident optical signal is emitted from it is a relatively constant and known value. The dual collimator is positioned so that the incident optical signal is directed to areas of the conductive membrane in the vicinity of a strategically located spacing post. When a voltage is applied between the conductive membrane and the electrodes on the second structural member, marked deformation of the conductive membrane occurs near the area of the strategically located spacing post. The incident optical signals are then received by the conductive membrane at or near the deformed areas and reflected at an angle that corresponds to the degree of deformation, which in turn is dependent on the voltage applied. Further, the degree of deformation, controllable by means of the applied voltage, will also affect the mode field and wavefront quality of the reflected optical signal, which together with the angle of deviation of the reflected optical signal can determine the ultimate level of attenuation achieved by such an optical attenuator.

Since the flexible membrane is micromachined to a very thin dimension, the actuating voltage required to deform such membrane is very low. Also because of the negligible mass of the flexible membrane, the device has very high shock tolerance. Also, since there are no moving parts that may cause wear due to friction, an optical attenuator of this invention is very reliable. Further, the addition of the support pads on the semiconductor structure is a cost efficient way to cause controlled deformation of the membrane so as to attain a wide attenuation range as well as a desired level of attenuation.

The present invention will be more fully understood in light of the following detailed description taken together with the drawings.

DESCRIPTION OF PREFERRED EMBODIMENTS

The present description is of the best presently contemplated mode of carrying out the invention. This description is made for the purpose of illustrating the general principles of the invention and should not be taken in a limiting sense. The scope of the invention is best determined by reference to the appended claims.

Figure 1:
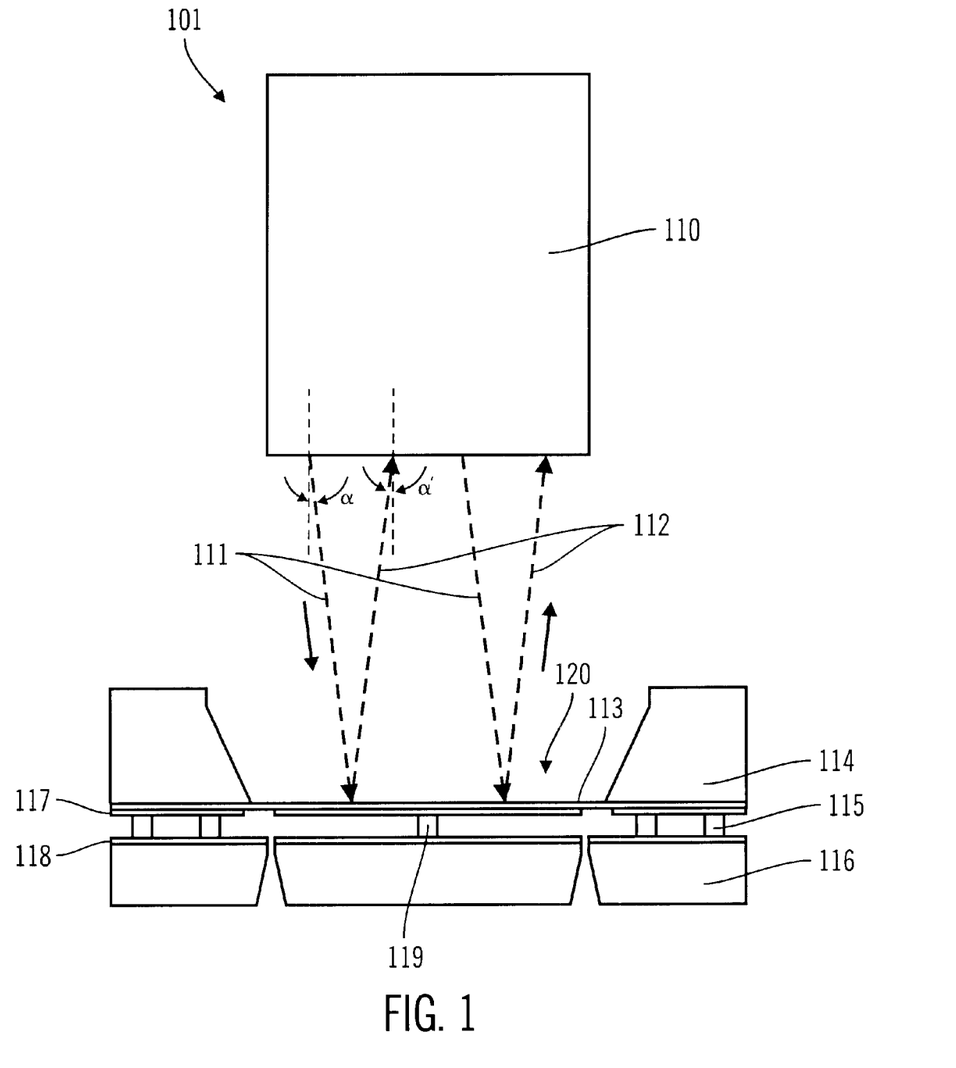
FIG. 1 is a schematic diagram of an optical attenuator in accordance with one embodiment of the present invention.

Turning first to FIG. 1, it is a schematic diagram of an optical attenuator 101 in accordance with one embodiment of the present invention. It has a planar mirror 113, which is a flexible conductive membrane, attached to an upper semiconductor structure 114. The upper semiconductor structure 114 is bonded with a lower semiconductor structure 116, separated by spacers 115. A spacing post 119 is placed between the lower and upper semiconductor structures, at or near the center of the planar mirror 113. Conductive layers 117 and 118 are coated on the bottom surface of the upper structure 114 and the top surface of the bottom structure 116. Such conductive layers can act as electrodes across which voltage is applied. When voltage is applied, the electrostatic force will cause the conductive layer 117 to bend toward the conductive layer 118, causing deformation of the planar mirror 113.

Figure 3:
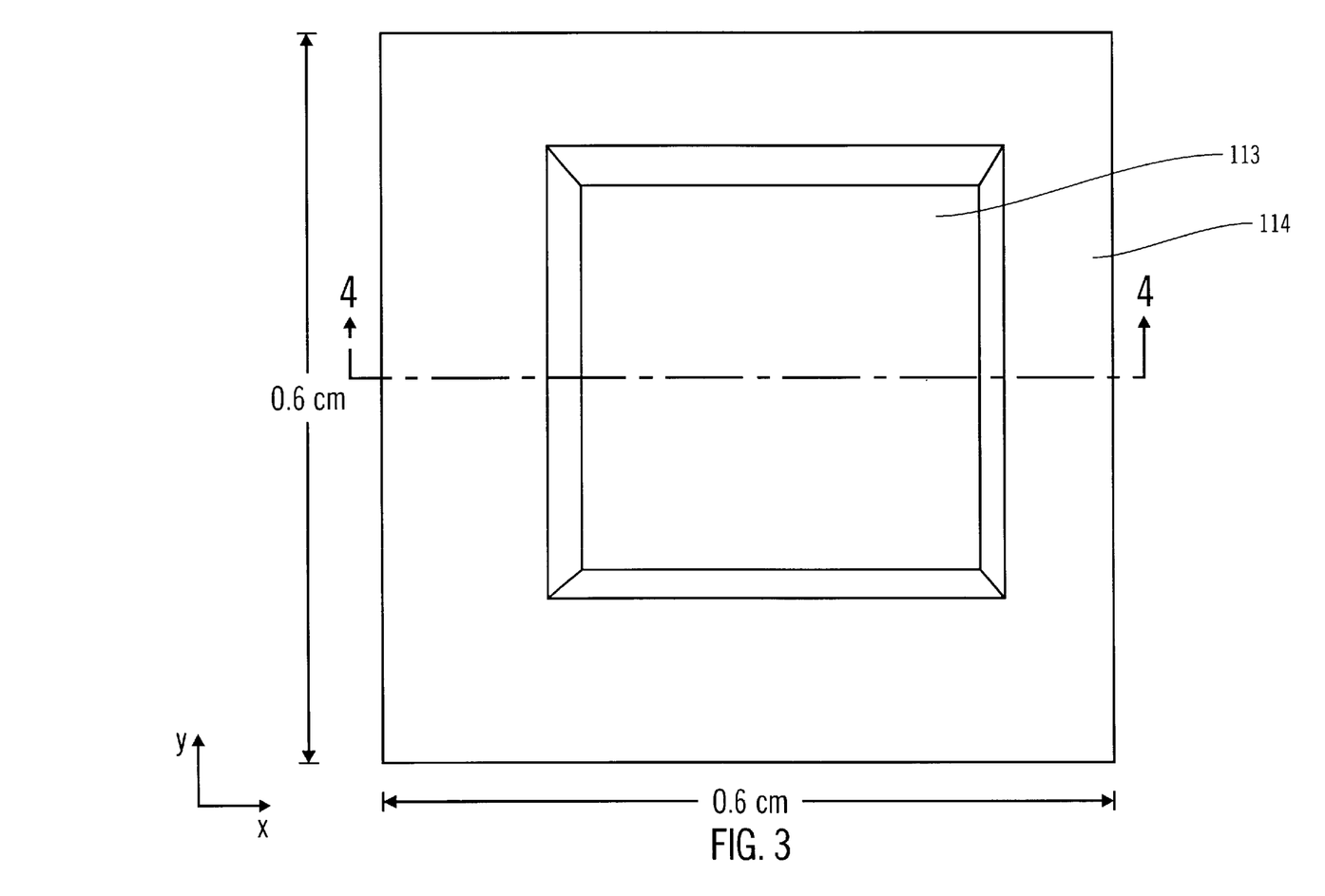
FIG. 3 is a top view of an upper structural member of an optical attenuator in accordance with one embodiment of the present invention.

In the described embodiment, the upper semiconductor structure 114 is a monocrystalline semiconductor material, such as silicon. However, other structural elements can also be used in other embodiments of the invention. The upper semiconductor structure 114 is approximately 0.6 cm×0.6 cm along the x-y axis as shown in FIG. 3, with a depth of about 400 microns. The dimensions of the outer perimeter of the upper semiconductor structure 114 is approximately equal to or slightly bigger than the dimensions of the outer perimeter of the spacers 115 in the lower semiconductor structure 116. An opening extends through the upper semiconductor structure 114 to define the reflective deformable area of the planar mirror 113. The dimensions of the opening 120 at the surface on which the planar mirror is placed are approximately equal to or slightly smaller than the dimensions of the inner perimeter of the spacers 115 in the lower semiconductor structure 116.

Figure 4:
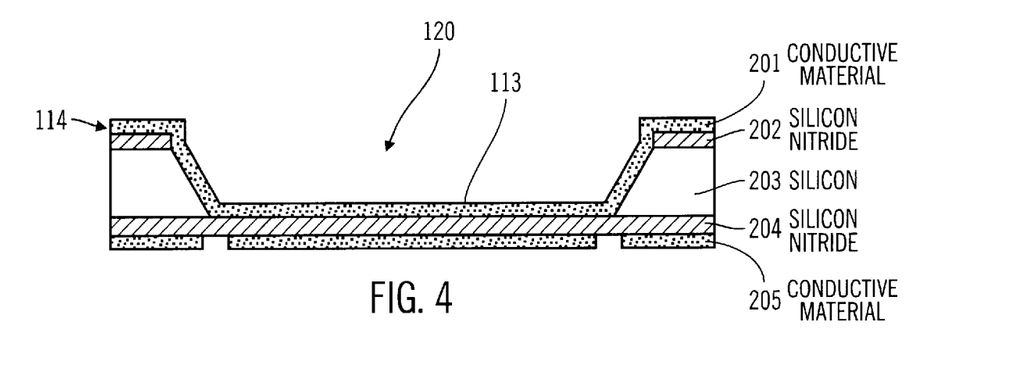
FIG. 4 is a cross sectional view of the upper structural member of an optical attenuator of FIG. 3 along section line 4—4 of FIG. 3.

FIG. 4 is a cross sectional view of the upper semiconductor structure 114 illustrating the various layers forming the structure 114. A low-stress, flexible membrane 204 (as shown in FIG. 4) stretches over the opening 120 framed by the upper semiconductor structure 114. In the described embodiment, membrane 204 is made of a silicon rich, silicon nitride material. The membrane 204 has a thickness of approximately 2,000 Angstroms. In other embodiments, membrane 204 can be made of other materials, including, but not limited to, polyimide or silicon nitride, of various thicknesses. The intrinsic tensile stress of membrane 204 tends to hold itself in a parallel plane. However, membrane 204 is pliant along the vertical direction. Thus, when one fixes the upper semiconductor structure 114, and a force is applied to membrane 204 along the vertical direction, membrane 204 deforms to move along the vertical direction. The forces required to deform membrane 204 are on the order of 500 $\mu$N. The amount of deformation along the vertical direction in the presence of these forces is approximately 0.5 microns.

In the described embodiment, the lower semiconductor structure 116 is a monocrystalline silicon wafer having a crystalline structure. The substrate has a thickness of about 400 to 700 microns. In other embodiments, other structural materials can also be used to form the semiconductor structure 116. As described in greater detail below, the upper and lower semiconductor structures 114 and 116 are bonded together to form the mirror part of the optical attenuator 101.

As shown in FIG. 1, according to one embodiment of the invention, a conductive layer 117 is deposited at or near the bottom surface of the upper semiconductor structure 114 and a conductive layer 118 is deposited at or near the top surface of the lower semiconductor structure 116. These conductive layers can be used as electrodes across which a voltage is applied. When a voltage is applied, the planar mirror 113 will be pulled down and deformed because of the electrostatic attraction force. On the other hand, the structural stiffness of the semiconductor structure 116 will offset the electrostatic attraction force and prevent the structure 116 from being deformed. To increase and better control the extent of the deformation of the planar mirror 113, a spacing post 119 is located between the upper semiconductor structure 114 supporting the planar mirror 113 and the lower semiconductor structure 116. As shown in FIG. 1, in one embodiment of the present invention, the spacing post 119 is located at the center of the planar mirror 113. The incident light beam 111 is to impinge on an area of the planar mirror 113 at or close to the center of the planar mirror 113. It should also be noted that the diameter of the incident light beam 111 should cover an area much larger than the diameter of the spacing post 119 in order to effect light deflection over a wide range of deformation of the planar mirror 113. The deformation of the planar mirror 113 in turn determines the attenuation level of the optical attenuator. The reflected light beam 112 has attenuated optical signals for various reasons. First, the deflection of the light beam causes partial angle misalignment with the receiving collimator and thus less light is coupled back to the receiving fibers. Second, the deformation of the planar mirror 113 also causes certain mode field changes as well as changes in wavefront qualities that may cause interferences, which in turn can attenuate the reflected optical signals. In general, the more the planar mirror is deformed, the higher the level of attenuation achieved.

Figure 5:
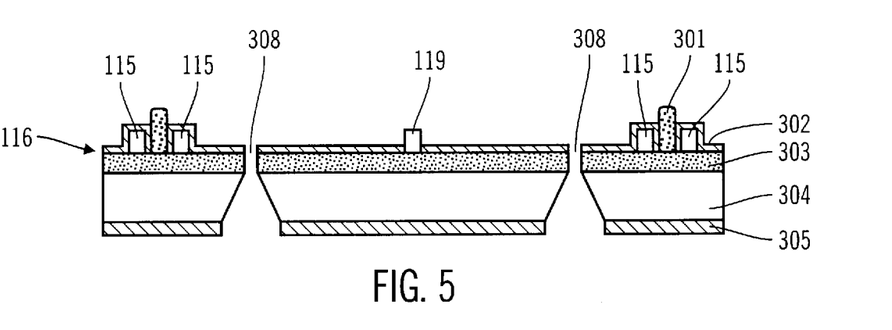
FIG. 5 is a cross sectional view of the lower structural member of an optical attenuator of FIG. 2 along section line 5—5 of FIG. 2.

FIGS. 4 and 5 are cross-sectional views of the upper and lower semiconductor structures illustrating the various layers forming such structures. As illustrated in FIG. 4, the conductive layer is formed by depositing conductive material 205 over a structure that comprises various layers of other materials, which together forms the upper semiconductor structure 114. Similarly, as illustrated in FIG. 5, the conductive layer is formed by deposited a layer of conductive material 302 over a structure that comprises various layers of other materials, which together forms the lower semiconductor structure 116. More details about the formation of the conductive layers and the upper and lower semiconductor structures 114 and 116 are given below in connection with the discussion of the fabrication process steps as illustrated in FIGS. 6a to 6d and FIGS. 7a to 7g.

Finally, as shown in FIG. 1, to complete the optical attenuator, an optical fiber structure 110 is positioned above the mirror structure 113. In one embodiment of this invention, a dual fiber collimator, where the input fiber and the output fiber are positioned in parallel, is used. The fibers used are single-mode fibers. In a dual fiber collimator, lenses are typically required. However, a person skilled in the art will recognize that other optical fiber structures may be used, including lensless structures, such as mode field expanded fibers disclosed in U.S. Pat. No. 5,915,063.

Figure 2:
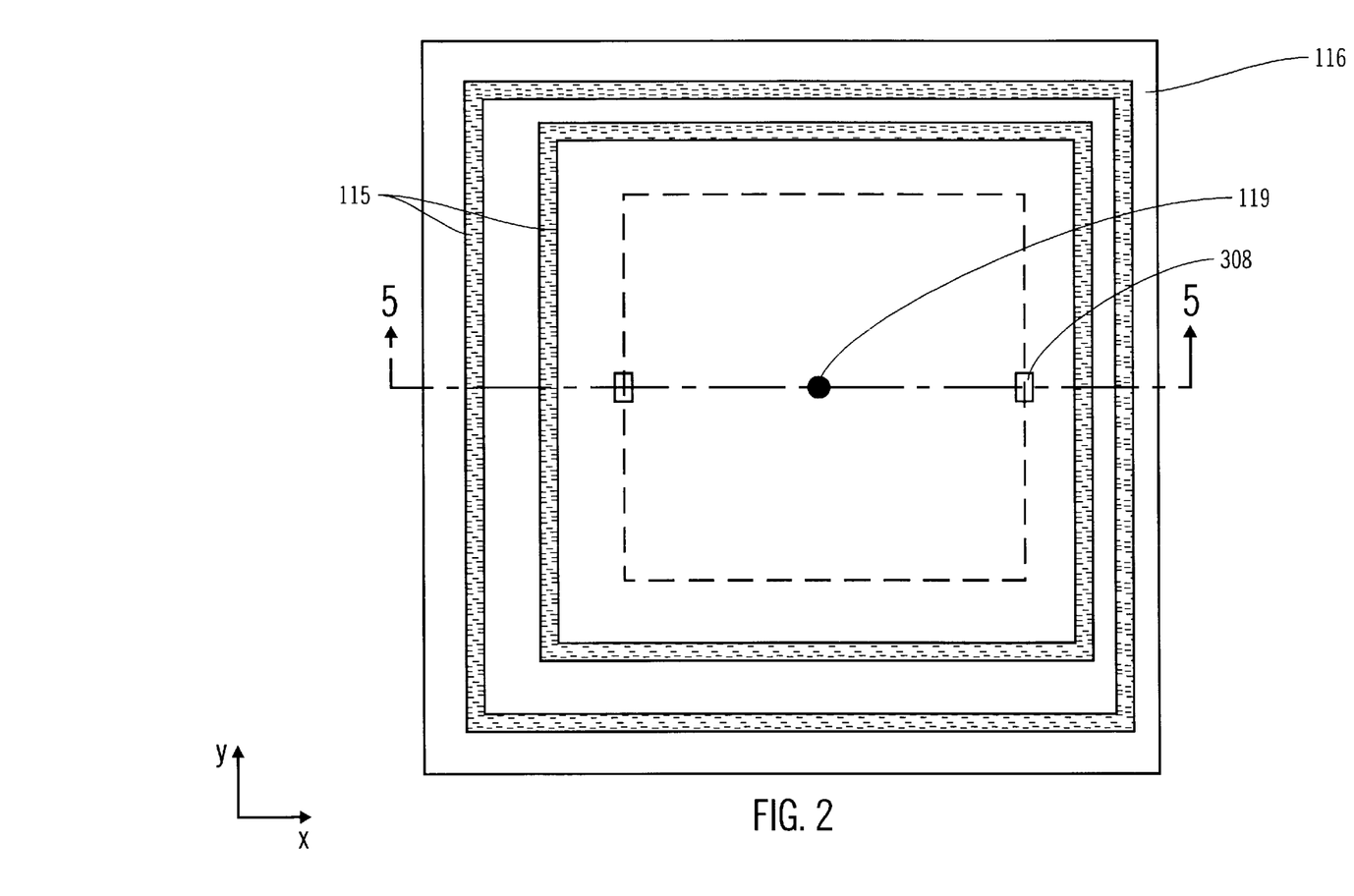
FIG. 2 is a top view of a lower structural member of an optical attenuator in accordance with one embodiment of the present invention.

FIG. 2 is the top view of the lower semiconductor structure 116 of an optical attenuator 101 in accordance with one embodiment of the present invention. As shown in FIG. 2, spacers 115 and a spacing post 119 are deposited on the lower semiconductor structure 116. The pattern and positioning of the spacing posts 115 and 119 are only illustrative.

FIG. 3 is the top view of the upper semiconductor structure 114 of an optical attenuator 101 in accordance with one embodiment of the present invention. As shown, a planar mirror 113 is deposited on the top surface of the upper semiconductor structure 114. As described in more detail below, the upper semiconductor structure 114 is bonded with the lower semiconductor structure 116 to form the part of the optical attenuator 101 that contains the deformable reflective mirror.

The optical attenuator 101 is fabricated as follows in accordance with one embodiment of the present invention.

FIGS. 6a to 6d illustrate the upper structural member 114 of an optical attenuator 101 in accordance with one embodiment of the present invention during selected processing steps.

Figure 6A:
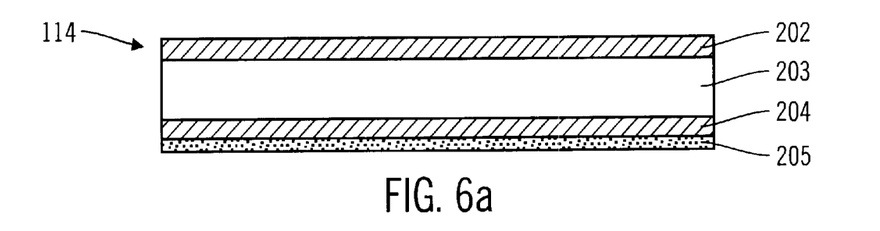
FIGS. 6a–d are cross sectional views illustrating the upper structural member of an optical attenuator of FIG. 3 during selected processing steps.
Figure 6B:
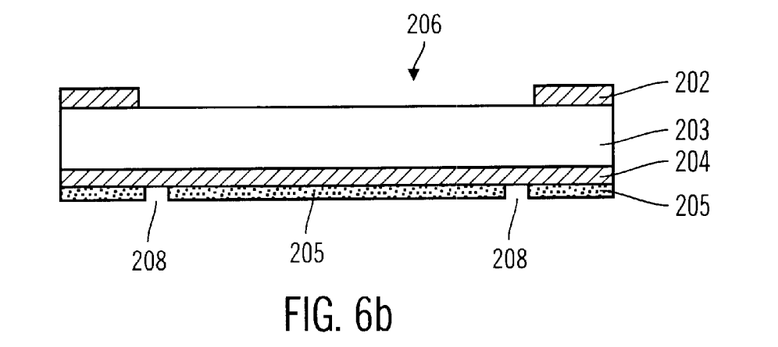
Figure 6C:
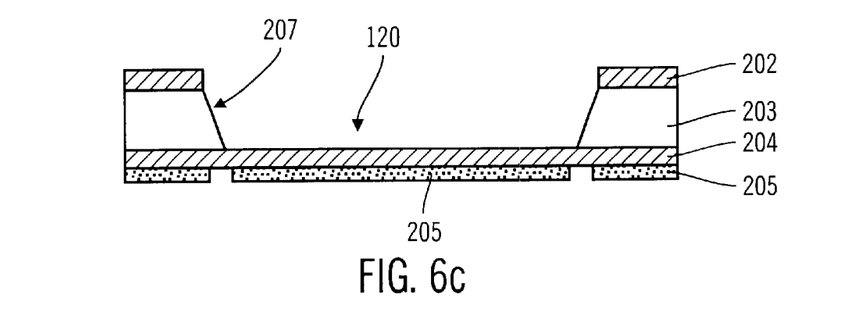

Initially, a monocrystalline silicon substrate 203 is cleaned. However, it is not necessary to polish the silicon substrate as the silicon wafer surface is smooth enough to allow a mirror of high quality to be formed thereon. Then, as illustrated in FIG. 6a, layers of silicon nitride 202 and 204 are deposited over the outer surfaces of the substrate 203. In the described method, the silicon nitride layers 202 and 204 each have a thickness of 4,000 Angstroms, although other thicknesses are possible. As illustrated in FIG. 6b, an opening 206 is obtained by photolithography process and plasma etching of the silicon nitride layer 202. A KOH etch is then performed on the exposed silicon substrate 203. As shown in FIG. 6c, the KOH etch forms an opening 120, which extends through substrate 203, then causing the substrate to form a frame 207. Because the KOH etch does not noticeably attack the silicon nitride layer 204, the silicon nitride layer 204 remains as a membrane across opening 120, as illustrated in FIG. 6c. This membrane has an inherent tensile stress due to the method of fabrication.

Then a metallic layer 205, preferably chrome or titanium (or some other type of metallic adhesion layer), followed by gold is evaporated (or sputtered) over the entire lower surface of the silicon nitride layer 204. This metallic layer 205 is then patterned and etched in accordance with conventional processing techniques to form gaps 208 as illustrated in FIG. 6b. These gaps are added to isolate the conductive electrodes (embedded in the metallic layer 205) in the upper semiconductor structure from the conductive materials 302 at the bonded edge between the upper and lower semiconductor structures. These gaps can reduce the risk of short circuits caused by particles, which may get between the upper and lower semiconductors around the bonded edge.

FIGS. 7a to 7g illustrate the lower structural member 116 of an optical attenuator 101 in accordance with one embodiment of the present invention during selected processing steps.

Figure 7A:
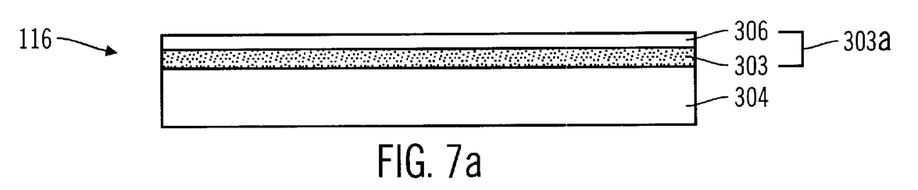
FIGS. 7a–g are cross sectional views illustrating the lower structural member of an optical attenuator of FIG. 2 during selected processing steps.

As illustrated in FIG. 7a, a thin layer of epitaxial silicon 303a is grown on one side of a silicon wafer 304. The epitaxial silicon layer consists of two regions with different levels of boron dopant concentrations. The first region 303 contains a high concentration of boron. The second region 306, which determines the height of spacing posts 115 and 119, has little or no boron. The heavily boron doped layer 303 acts as an etch stop to a KOH etch during a step of the process, as described later. It can be appreciated that other doping-dependent etch stop methods, including electro-chemical etch stop methods, can be used. Also, other types of anisotropic etches other than a KOH etch, such as ethylene diamine pyrocatechol (EDP), can perform similar etch stop functions. The use of epitaxial growth of the silicon layer 303a to form the spacing posts 115 and 1 9 also allows very precise adjustment of the spacing posts' height, which is important for determining the range of deformation allowable for the resulting optical attenuator. It is desirable to create a mechanism in which maximum deformation can be attained at minimum applied voltage. Therefore, when designing the spacing posts' heights, it is desirable to make them as short as possible so as to increase the electrostatic forces between the upper and the lower structures. The spacing between the two structures must also be controlled very carefully to ensure uniform performance from device to device across the wafer, as well as from one wafer to another.

Further, to avoid "snap over" phenomenon (i.e., the conductive layer 205 in the upper semiconductor structure accidentally becomes stuck with the lower semiconductor structure because of electrostatic instability), it is advised that the extent of vertical deformation of the planar mirror 113 should be no more than one-third of the gap between the upper and lower semiconductor structures. For example, in the described embodiment, the gap is designed to be around 6 microns thick; thus, it is advisable that the deformation be kept within 2 microns along the vertical plane.

Figure 7B:
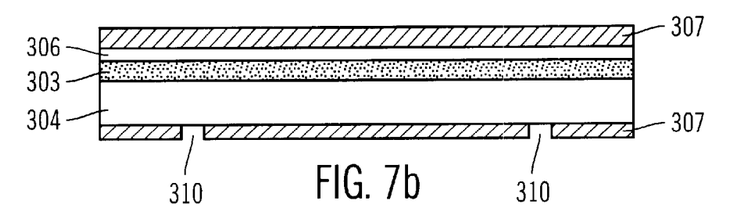
Figure 7C:
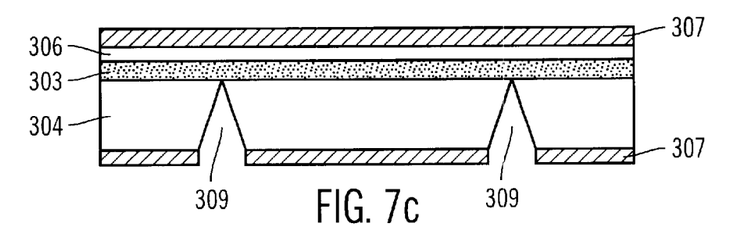

Then a layer of silicon nitride 307 is deposited on the bottom surface of the silicon wafer and above the epitaxial silicon layer 306. In the described embodiment, this silicon nitride layer has a thickness of 2,000 Angstroms. Openings 310 are obtained by photolithography processing and plasma etching on the silicon nitride layer 307 on the bottom surface of the wafer, i.e., the surface opposite to the epitaxial silicon layer, as illustrated in FIG. 7b. A KOH etch is then performed on the exposed silicon substrate 304. As shown in FIG. 7c, the KOH etch forms openings 309, which extends through substrate 304, and stops at the heavily boron-doped epitaxial silicon layer 303.

Figure 7D:
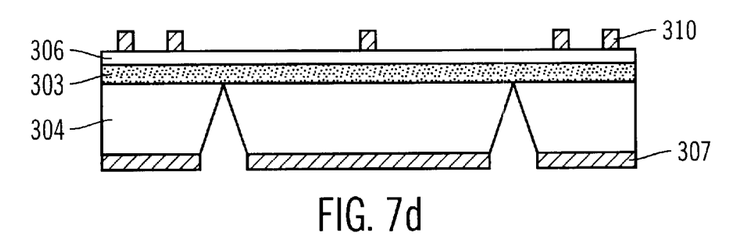
Figure 7E:
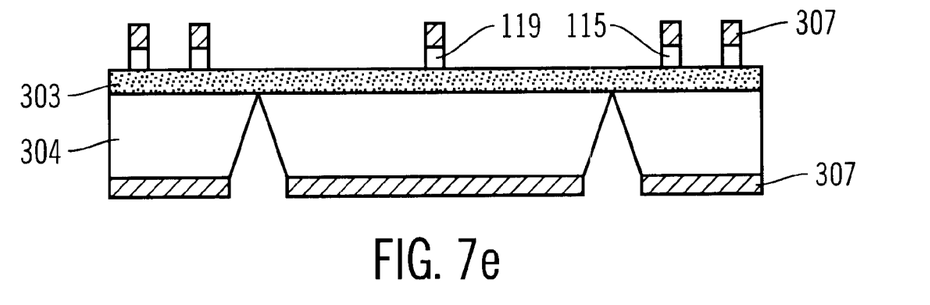
Figure 7F:
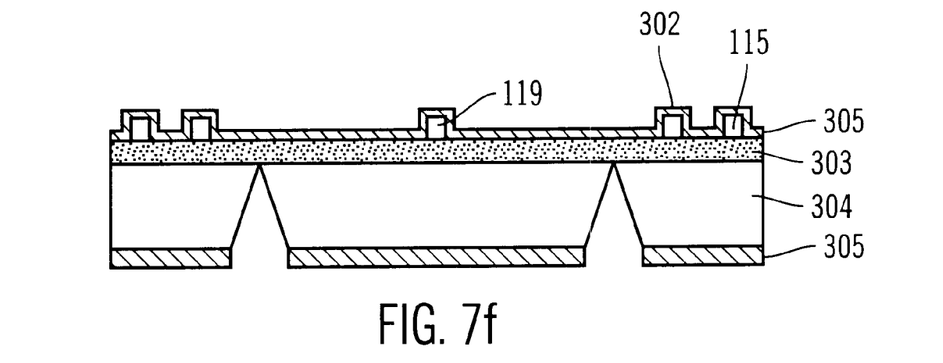
Figure 7G:
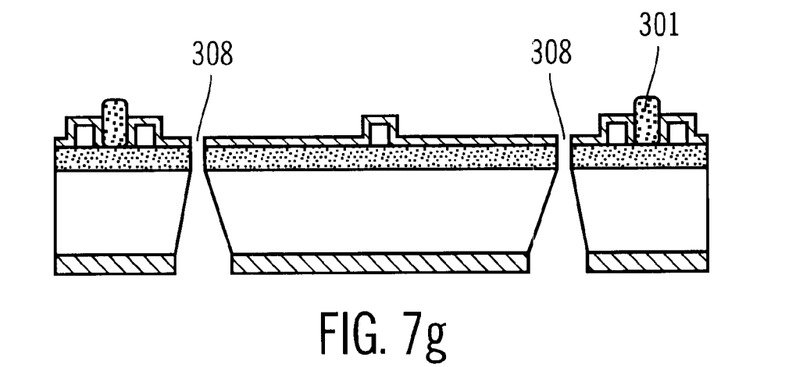

A photoresist layer is patterned on the silicon nitride layer 307 on the epitaxial silicon layer 306. Plasma etching of the silicon nitride layer 307 leaves the remaining posts 310 on the epitaxial silicon layer 306, as shown in FIG. 7d. A KOH etch on the epitaxial silicon layer 306 etches down to the heavily boron-doped epitaxial silicon layer 303, as described in FIG. 7e. The remaining silicon nitride on top of the posts 310 and on the bottom surface of the wafer is then stripped away. A layer of silicon dioxide 305 is then thermally grown on all surfaces of the wafer, as shown in FIG. 7f. A metallic layer 302, preferably chrome or titanium (or some other type of metallic adhesion layer), followed by gold is then evaporated (or sputtered) on the epitaxial silicon side of the wafer, as shown in FIG. 7f. A pattern for forming holes 308 is photolithographically defined on the metallic layer 302 and the metallic layer is etched. Solder pieces 301 are plated in selected areas on top of the metallic layer 302 using a photolithographically patterned masking layer applied prior to plating, as shown in FIG. 7g. Finally, holes 308 are etched through the epitaxial silicon layer 303 using a reactive ion etching process to allow air venting, as shown in FIG. 7g. Patterning the gold layer at the bottom of the lower semiconductor structure has several functions other than opening areas for etching to create holes 308. First, it isolates the drive electrode from the edge of the silicon wafer, which helps reducing the risks of short circuiting. Second, it allows pads to be formed for wire bonding during packaging. Third, it creates alignment marks for aligning the upper and lower semiconductor structures during the bonding step.

In addition, auxiliary posts (not shown in the figures) formed by conventional photoresist methods can be positioned between the center post 119 and the inner support ring 115 on the lower semiconductor structure. These auxiliary posts are lower in height than the center post 119 and the inner support ring 115, which determine the dimension of the gap between the upper and lower semiconductor structures. These auxiliary posts prevent the upper semiconductor structure from contacting the electrode on the lower semiconductor structure and thus from causing damage to the device in case the voltage applied to the device accidentally becomes too large for the device.

Although FIGS. 6a–6b and FIGS. 7a–7g illustrate the fabrication of the mirror part of a single optical attenuator 101, it is understood that many parts can be simultaneously (i.e., batch) fabricated on a silicon wafer. These batch-fabricated parts for optical attenuators can be diced into individual pieces in accordance with well known semiconductor processing techniques. Alternatively, these batch-fabricated optical attenuators can be used as an integrated array of optical attenuators.

Figure 6D:
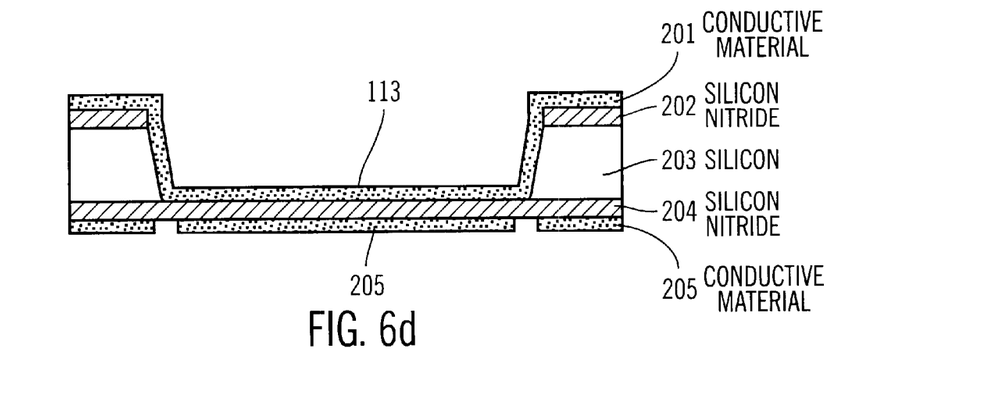
Figure 8:
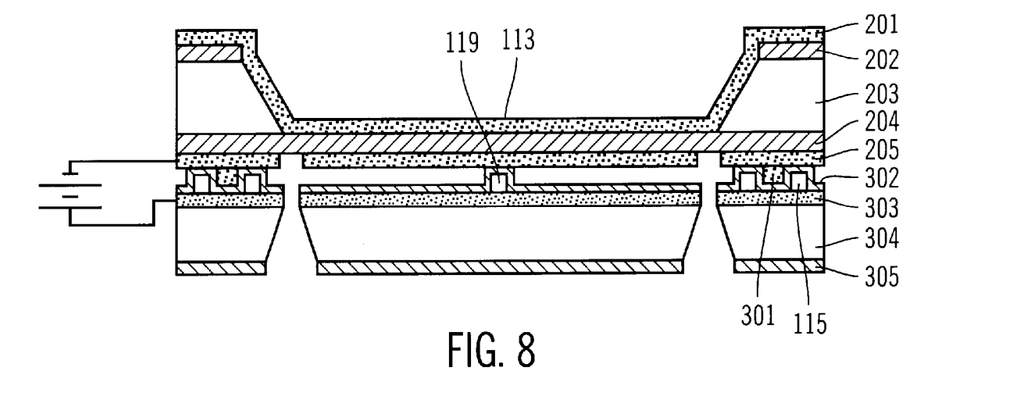
FIG. 8 is a cross sectional view illustrating the lower and upper structural members of an optical attenuator of FIGS. 2 and 3 after bonding.

FIG. 8 illustrates a cross sectional view of the finished optical attenuator in accordance with one embodiment of the present invention. It shows the combination of the upper semiconductor structure as illustrated in FIG. 6d and the lower semiconductor structure as illustrated in FIG. 7g. Using heat and pressure to index the upper semiconductor structure against the spacing posts 115 and 119 on the lower semiconductor structure, the plated solder 301 on the lower semiconductor structure will bond to the metallic layer 205 on the bottom surface of the upper semiconductor structure.

Electrodes (not shown) may be provided to apply a potential between upper and lower semiconductor structures by conventional means. One method of providing electrical contact to the electrodes on the upper and lower semiconductor structures is via bonding to the solder pads formed on the lower semiconductor structure. Electrical contact between the metalized electrodes on the upper and lower semiconductor structures is provided through the solder pads, which hold the two structures together.

The operation of the optical attenuator is now described. As shown in FIG. 1, a collimated beam of incident optical signals 111 emit from the input fiber. Typically the light beam emitting from the fiber structure undergoes some refraction. The angle of deflection $\alpha$, depending largely on the location of the beam at the fiber/air interface relative to the optical axis of the collimating lenses 110, is predictable. The collimating lenses 110 is positioned so that the incident light beam 111 will impinge at or near the center of the planar mirror 113. The incident light beam 111 is then reflected by the planar mirror 113; a reflected light beam 112 will then be sent back to the collimating lenses 110. FIG. 1 illustrates an optical attenuator that has a flat or undeformed planar mirror 113, which means that the level of attenuation should be at its minimum. As in such a position, the reflection at the planar mirror 113 should be near perfect; the angle at which the reflected light is received by the collimating lenses 110, $\alpha'$, should be almost equal to the angle of deflection $\alpha$ for the incident light beam emitting from the optical fiber structure. The receiving fiber (not shown) is positioned at the opposite end of the collimating lenses 110 to receive the most amount of the reflected light beam at this minimum level of attenuation. In the described embodiment, the optical fiber structure is a dual fiber collimator.

Figure 9A:
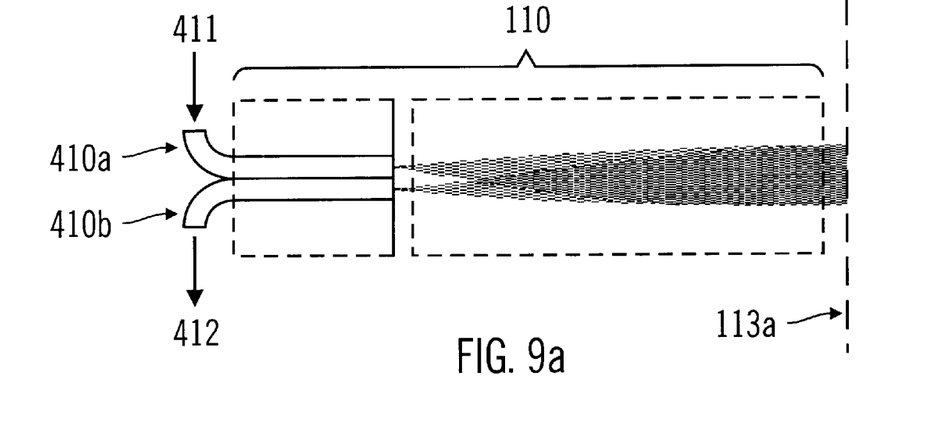
FIG. 9a is a schematic drawing showing the reflection pattern of the light beam before the deformation of the mirror of an optical attenuator in accordance with one embodiment of this invention
Figure 9B:
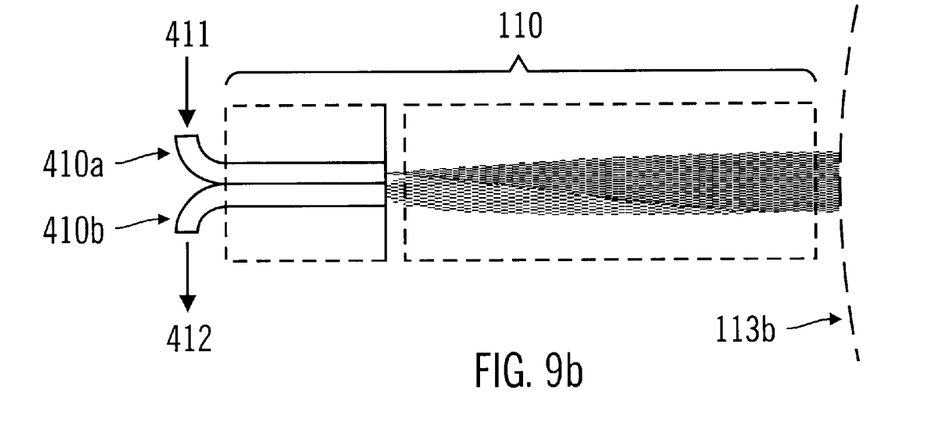
FIG. 9b is a schematic drawing showing the reflection pattern of the light beam after the deformation of the mirror of an optical attenuator in accordance with one embodiment of this invention.

As shown in FIG. 9a, with no deformation on the mirror 113a, the collimating lenses 110 focus the reflected beam 412 at the core of the receiving fiber 410b (from input beam 411 through fiber 410a), thus maximizing the coupling effect. As the semiconductor substrate (and thus the mirror) deforms, as shown in FIG. 9b, the curvature of the mirror 113b spreads the profile of the beam 412 outward away from the core as it enters the receiving fiber 410b. As more of the beam energy spreads from the core, the coupling is reduced and the attenuation is increased. To ensure that the system allows a maximum degree of deformation, it is contemplated that the width of the center post size is negligible, compared to the width of the laser beam.

While the invention has been described in detail with respect to the illustrated embodiments in accordance therewith, it will be apparent to those skilled in the art that various changes, modifications, substitutions, alterations and improvement may be made without departing from the scope and spirit of the invention as defined by the appended claims.

What is claimed is:

1. A controllable, deformable reflective device for receiving and reflecting optical signals, comprising:

(a) a substrate;

(b) a flexible membrane defining a reflective surface and a bottom surface;

(c) a spacing post disposed between said substrate and said bottom surface of said flexible membrane in a manner such as to define deformation of said reflective surface when said flexible membrane is biased toward the said substrate.

2. A controllable, deformable reflective device of claim 1, further comprising:

a frame having an opening over which said flexible membrane extends.

3. A controllable, deformable reflective device of claim 2, wherein said frame comprises a monocrystalline silicon structure.

4. A controllable, deformable reflective device of claim 1, further comprising:

an actuator means controllably connected with said substrate and said flexible membrane for controlling the deformation of said reflective surface.

5. A controllable, deformable reflective device of claim 4, further comprising:

(a) a first conductive element connected to said substrate;

(b) a second conductive element connected to said flexible membrane; and (c) wherein said actuator means is an electrostatic actuator controllably connected with said first and second conductive elements.

6. A controllable, deformable reflective device of claim 1, wherein said substrate is a monocrystalline silicon structure.

7. A controllable, deformable reflective device of claim 4, wherein said spacing post is formed by epitaxial silicon crystalline growth.

8. A controllable, deformable reflective device of claim 4, wherein said spacing post is formed, using a doping dependent etch stop method.

9. A controllable, deformable reflective device of claim 4, wherein said spacing post is formed, using a highly boron doped layer etch stop method.

10. A controllable, deformable reflective device of claim 4, wherein said spacing post is formed using an electrochemical etch stop method.

11. A controllable, deformable reflective device of claim 1, wherein said flexible membrane comprises silicon nitride.

12. A controllable, deformable reflective device of claim 1, further comprising:

bonding means for joining said substrate and said flexible membrane.

13. A controllable, deformable reflective device of claim 9, wherein said bonding means comprises solder.

14. An optical attenuating device for controllably coupling optical signals from an incident optical beam and an output optical waveguide, comprising:

(a) a controllable, deformable reflective device of claim 1;

(b) first and second optical waveguides for emitting the incident optical beam and receiving an optical signal upon its reflection from said reflective element.

15. An optical attenuating device of claim 14, wherein said optical waveguide comprises a dual fiber collimator.

16. An optical attenuating device of claim 14, wherein said first and second optical waveguide occupy the same structure.

* * * * *